(12) United States Patent
Kikuchi

(10) Patent No.: US 7,456,888 B2
(45) Date of Patent: Nov. 25, 2008

(54) PHOTOELECTRIC CONVERSION DEVICE AND IMAGE PICK-UP SYSTEM USING THE PHOTOELECTRIC CONVERSION DEVICE

(75) Inventor: Shin Kikuchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 746 days.

(21) Appl. No.: 10/724,763

(22) Filed: Dec. 2, 2003

(65) Prior Publication Data

US 2004/0119864 A1    Jun. 24, 2004

(30) Foreign Application Priority Data

Dec. 3, 2002    (JP)    ............................. 2002-351290

(51) Int. Cl.
H04N 5/335    (2006.01)
(52) U.S. Cl. ...................... 348/308; 348/300
(58) Field of Classification Search ................ 257/230, 257/291, 292; 348/314, 294, 299, 308, 300; 250/208.1
See application file for complete search history.

(56) References Cited

U.S. PATENT DOCUMENTS

| | | | |
|---|---|---|---|
| 5,352,920 A | 10/1994 | Morishita et al. | 257/435 |
| 5,831,298 A * | 11/1998 | Kawamoto et al. | 257/223 |
| 6,084,273 A * | 7/2000 | Hirota | 257/368 |
| 6,180,969 B1 * | 1/2001 | Yang et al. | 257/291 |
| 6,211,509 B1 * | 4/2001 | Inoue et al. | 250/208.1 |
| 6,215,521 B1 * | 4/2001 | Surisawa et al. | 348/314 |
| 6,259,124 B1 | 7/2001 | Guidash | 257/292 |
| 6,281,533 B1 * | 8/2001 | Miyagawa et al. | 257/290 |
| 6,326,230 B1 | 12/2001 | Pain et al. | 438/57 |
| 6,344,670 B2 * | 2/2002 | Yamaguchi et al. | 257/292 |
| 6,403,998 B1 * | 6/2002 | Inoue | 257/292 |
| 6,433,337 B1 * | 8/2002 | Shimizu | 250/307 |
| 6,433,374 B1 | 8/2002 | Fukunaga et al. | 257/292 |
| 6,504,193 B1 * | 1/2003 | Ishiwata et al. | 257/291 |
| 6,552,712 B1 * | 4/2003 | Koizumi | 345/104 |
| 6,586,789 B1 * | 7/2003 | Zhao | 257/292 |
| 6,690,423 B1 * | 2/2004 | Nakamura et al. | 348/311 |
| 6,765,246 B2 * | 7/2004 | Inagaki | 257/223 |
| 6,778,214 B1 * | 8/2004 | Toma | 348/314 |
| 7,116,365 B1 * | 10/2006 | Ueno et al. | 348/308 |

FOREIGN PATENT DOCUMENTS

| | | |
|---|---|---|
| EP | 0 544 260 A1 | 6/1993 |
| EP | 0 862 219 A2 | 9/1998 |

(Continued)

Primary Examiner—Lin Ye
Assistant Examiner—Amy Hsu
(74) Attorney, Agent, or Firm—Fitzpatrick, Cella, Harper & Scinto

(57) ABSTRACT

In a photoelectric conversion device with a photoelectric conversion region for accumulating electric charges that correspond to incident light and an amplifying filed effect transistor into which a signal charge from the photoelectric conversion region is inputted, the photoelectric conversion region is surrounded by a potential barrier region (a selectively oxidized film and a channel stopper), a nick region (overflow channel) is formed in a part of the potential barrier region, and a drain region of the field effect transistor that has the same conductivity type as the photoelectric conversion region is placed next to the nick region. Thus excess carriers are prevented from flowing into adjacent pixels or other floating regions.

14 Claims, 10 Drawing Sheets

FOREIGN PATENT DOCUMENTS

| | | |
|---|---|---|
| EP | 0 964 570 A2 | 12/1999 |
| EP | 1 107 315 A1 | 6/2001 |
| EP | 1 119 188 A2 | 7/2001 |
| EP | 1 376 701 A2 | 1/2004 |
| JP | 11-284168 A | 10/1999 |
| JP | 11-355668 A | 12/1999 |
| JP | 2000-260971 A | 9/2000 |
| JP | 2002-203954 A | 7/2002 |

* cited by examiner

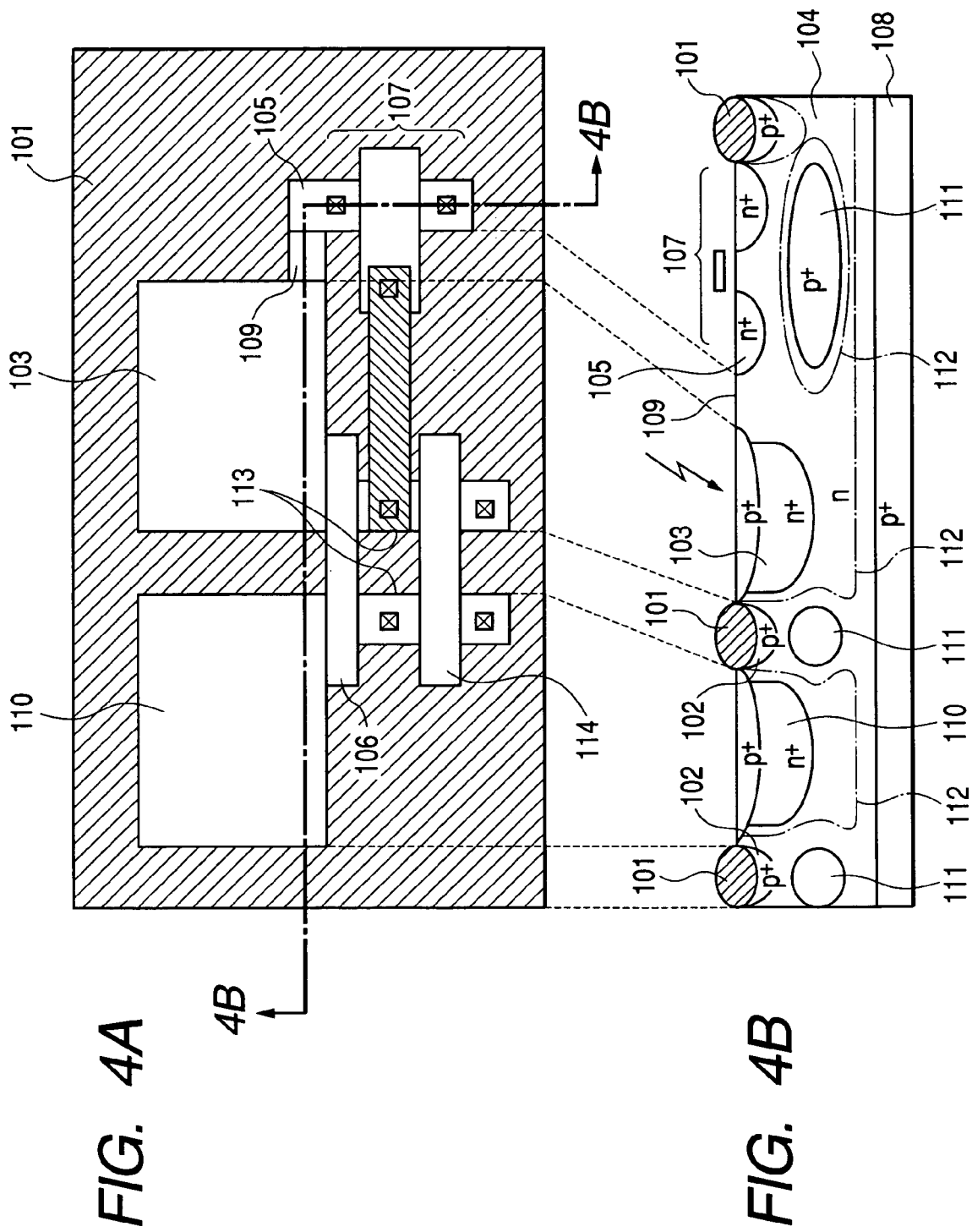

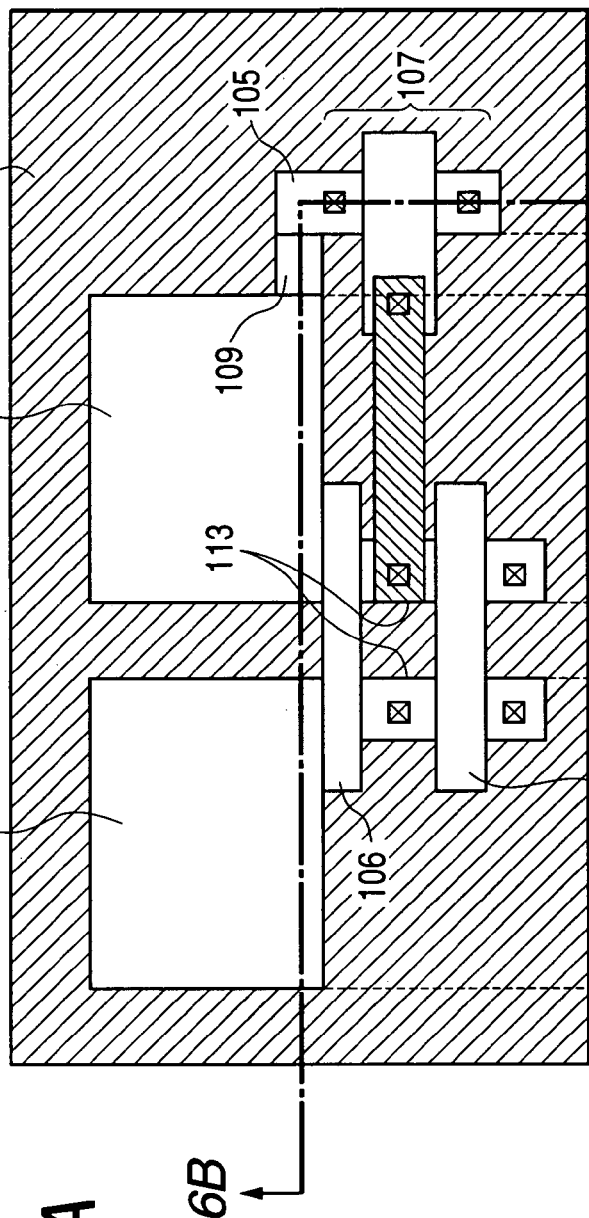
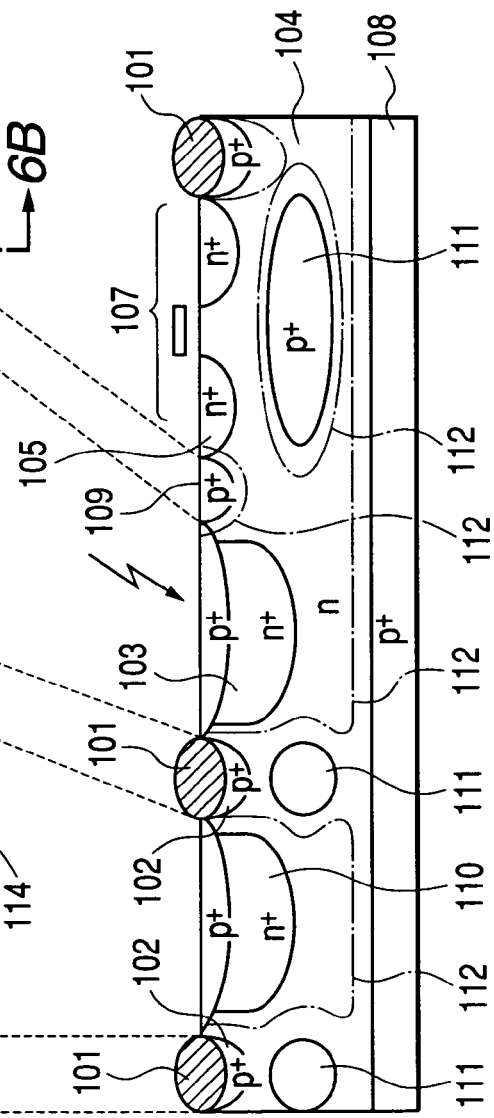
FIG. 6A
FIG. 6B

PHOTOELECTRIC CONVERSION DEVICE AND IMAGE PICK-UP SYSTEM USING THE PHOTOELECTRIC CONVERSION DEVICE

BACKGROUND OF THE INVENTION

1. Field of the Invention

The present invention relates to a photoelectric conversion device and more specifically to a photoelectric conversion device in which a signal charge from a photoelectric conversion region that accumulates electric charges corresponding to incident light is inputted to a field effect transistor that is provided for amplification.

2. Related Background Art

FIG. 10A is a plan view showing the structure of a conventional CMOS sensor, and FIG. 10B is a schematic sectional view taken along the line 10B-10B of FIG. 10A. As shown in FIGS. 10A and 10B, a photodiode 1003 is formed in a p-well 1004. Electric charges accumulated in the photodiode 1003 are sent to a floating diffusion region 1011 and to a gate of a MOS transistor 1007, which is connected to the floating diffusion region 1011, when the electric potential of a transfer electrode 1006 is set to the high level. The MOS transistor 1007 amplifies the electric charges to output signals. As shown in FIG. 10B, the photodiode 1003 adjoins to a photodiode 1010 of an adjacent pixel and to a drain region 1005 of the MOS transistor 1007, with a selectively oxidized film 1001 separating the photodiode 1003 from 1010 and 1005. Note that a MOS transistor for reading electric charges accumulated in the photodiode 1010 is omitted from FIGS. 10A and 10B. There is a junction between the photodiode 1003 and the p-well 1004, and of electrons and holes generated by irradiation of light, the electrons are accumulated in the photodiode 1003 whereas the holes are discharged toward a substrate 1008. The photodiode 1003 is sandwiched between the p-well 1004 and a p+ region that is on the front side, constituting a buried photodiode.

In the device structure that uses the selectively oxidized film 1001, when the photodiode 1003 reaches saturation, electrons seep into the adjacent pixel (the photodiode 1010 in this example) instead of the drain region, causing cross talk.

Denoted by 1002 is a channel stopper under the selectively oxidized film 1001.

This device structure is contrasted by one disclosed in, for example, Japanese Patent Application Laid-Open No. 2000-260971, in which a photodiode is surrounded by diffusion layers or the like that are connected to a power source to make the diffusion layers double as a lateral overflow drain (LOD). However, this is an insufficient solution because carriers to be collected are also taken into the drain regions, thus lowering the efficiency.

SUMMARY OF THE INVENTION

A photoelectric conversion device of the present invention has a plurality of photoelectric conversion regions each having a first semiconductor region for accumulating electric charges that correspond to incident light and a plurality of amplifying field effect transistors into which a signal charge from the photoelectric conversion region is inputted, and is characterized in that:

each photoelectric conversion region is surrounded by a potential barrier region;

a nick region is formed in a part of the potential barrier region; and one of main electrode regions of the field effect transistor is placed adjacent to the nick region, the main electrode region having the same conductivity type as the first semiconductor region.

The above-described photoelectric conversion device of the present invention improves the efficiency in collecting carriers (electric charges) generated by surrounding a pixel with a potential barrier and by using, if carriers to be accumulated in the photoelectric conversion region are electrons, a p type impurity or the like to form the potential barrier. In this way, carriers can be prevented from seeping into adjacent pixels and other regions.

In some cases, however, it is required to release carriers to a desired portion once the saturation is reached. For that reason, the potential barrier is partially removed, and a main electrode region (drain region, for instance) of the field effect transistor is placed in front of the nick in the barrier. At that time, within the range of the proximity effect of potentials, this effect is obtained merely by removing the impurity used to form the barrier. It is also possible to control the height of the barrier by adjusting the width of the gap that is left by the removal.

The barrier may be further lowered by introducing an impurity to the region where the barrier is partially removed. This is achieved by introducing a dopant in a concentration lower than the barrier impurity concentration, or by counter doping of the region in question with a dopant of opposite conductivity type to thereby lower the effective impurity concentration of the region. As a result, excess carriers can steadily flow out to the lateral overflow drain (LOD) when the photodiode nears saturation.

As described above, excess carriers are prevented from flowing into adjacent pixels or other floating diffusion regions when the diode nears saturation by forming the LOD (lateral overflow drain) such that the photoelectric conversion region is surrounded by a potential barrier, a part of the barrier is removed to form a low barrier portion, and a main electrode region (drain region or source region) is placed in front of the low barrier portion. Accordingly, smearing and cross talk can be avoided and thus a photoelectric conversion device having higher sensitivity and less cross talk is obtained.

Another aspect of the present invention includes a photoelectric conversion device including a plurality of photoelectric conversion regions each having a first semiconductor region for accumulating electric charges that correspond to incident light; and a plurality of amplifying field effect transistors into which a signal charge from the photoelectric conversion regions is inputted: and a second semiconductor region connected to a gate of each amplifying field effect transistor, and is characterized in that:

a potential barrier region surrounds each photoelectric conversion region, a low potential barrier region is formed in a part of said potential barrier region and has a potential lower than a potential of the other part of said potential barrier region, a transfer region transfers the signal charges in each of the first semiconductor regions to the second semiconductor regions, and one of main electrode regions of the field effect transistors is placed adjacent to said low potential barrier region, said main electrode region having the same conductivity type as said first semiconductor region.

BRIEF DESCRIPTION OF THE DRAWINGS

FIG. 4A is a plan view showing the structure of a photoelectric conversion device according to a fourth embodiment of the present invention, and FIG. 4B is a schematic sectional view taken along the line 4B-4B of FIG. 4A;

FIG. 6A is a plan view showing the structure of a photoelectric conversion device according to a sixth embodiment of the present invention, and FIG. 6B is a schematic sectional view taken along the line 6B-6B of FIG. 6A;

FIG. 8A is a plan view showing the structure of a photoelectric conversion device according to an eighth embodiment of the present invention, and FIG. 8B is a schematic sectional view taken along the line 8B-8B of FIG. 8A;

DESCRIPTION OF THE PREFERRED EMBODIMENTS

Detailed descriptions will be given below on embodiments of the present invention with reference to the drawings.

First Embodiment

Figures 1A, 1B:
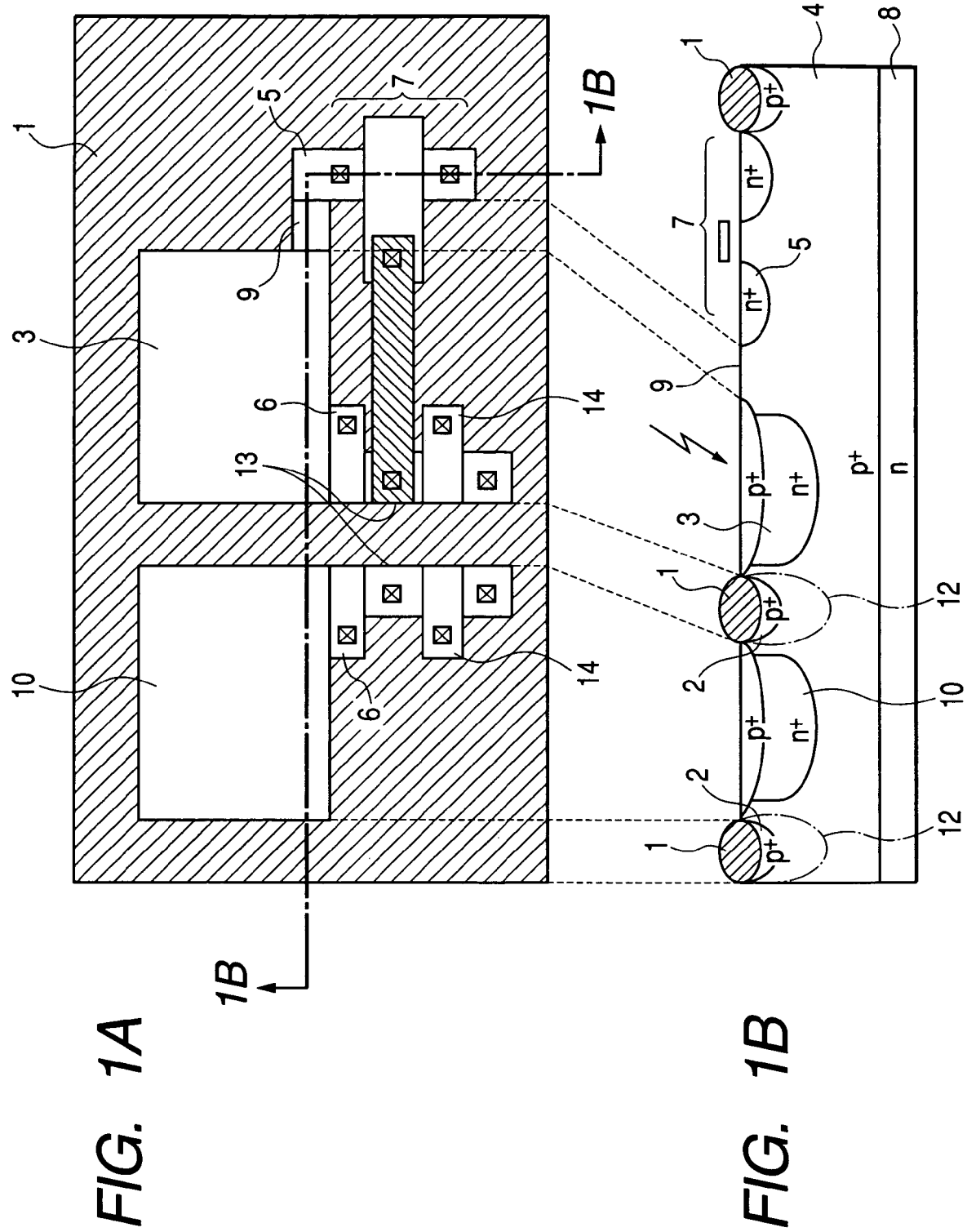
FIG. 1A is a plan view showing the structure of a photoelectric conversion device according to a first embodiment of the present invention.
FIG. 1B is a schematic sectional view taken along the line 1B-1B of FIG. 1A.
Figures 10A, 10B:
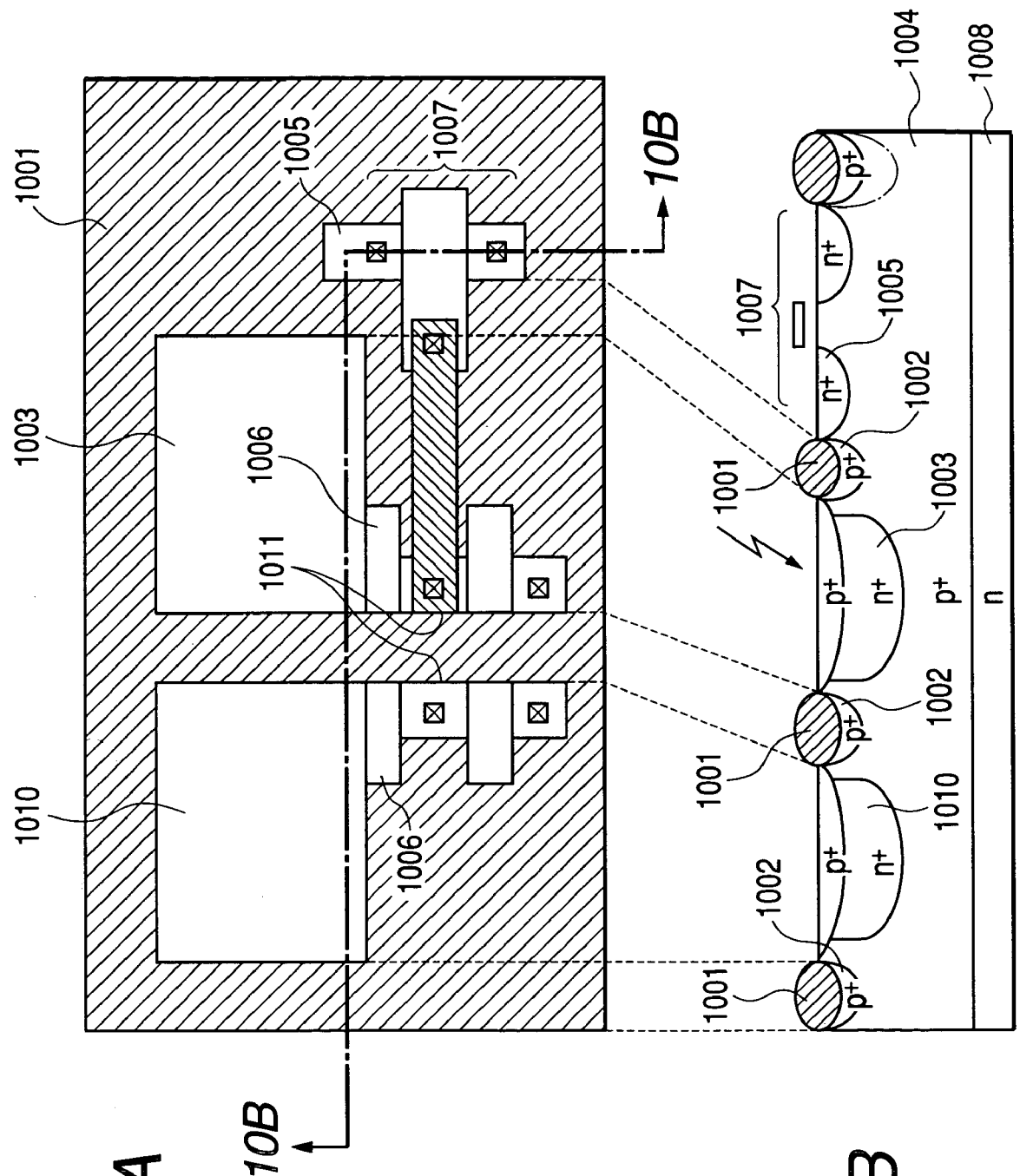
FIG. 10A is a plan view showing the structure of a conventional photoelectric conversion device.
FIG. 10B is a schematic sectional view taken along the line 10B-10B of FIG. 10A.

FIG. 1A is a plan view showing the structure of a photoelectric conversion device according to a first embodiment of the present invention, and FIG. 1B is a schematic sectional view taken along the line 1B-1B of FIG. 1A. As shown in FIGS. 1A and 1B, a photodiode (to serve as a photoelectric conversion region) 3 is formed in a p-well 4. Electric charges accumulated in the photodiode 3 are sent to a floating diffusion region 13 and to a gate of a MOS transistor 7, which is connected to the floating diffusion region 13, when the electric potential of a transfer electrode 6 is set to the high level. The MOS transistor 7 amplifies the electric charges to output signals. As shown in FIG. 1B, the photodiode 3 adjoins to a photodiode 10 (to serve as a photoelectric conversion region) of an adjacent pixel with a selectively oxidized film 1 separating the photodiode 3 from the photodiode 10 (the selectively oxidized film 1 surrounds the perimeters of the photodiodes 3 and 10). Reference numeral 2 denotes a channel stopper (channel stopping layer) under the selectively oxidized film 1. Denoted by 5 is a drain region as a main electrode region of the MOS transistor 7. Reference numeral 8 represents a substrate and 14, a gate of a resetting MOS transistor that is provided to reset the floating diffusion region 13 to a given electric potential. Note that, although the main electrode region in this embodiment is the drain region, a source region of a field effect transistor may serve as the main electrode region. A MOS transistor for reading electric charges accumulated in the photodiode 10 is omitted from FIGS. 1A and 1B. Of electrons and holes generated by irradiation of light, the electrons are accumulated in the photodiode 3 whereas the holes are discharged toward the substrate 8. The photodiode 3 is sandwiched between the p-well 4 and a p+ region that is on the front side, constituting a buried photodiode. The photodiode 3, which is formed in the p-well 4 in this embodiment, may instead be formed on a semiconductor substrate or in an epitaxial layer. The drain region 5 is desirably connected to a fixed electric potential or a similar electric potential. Denoted by 9 is a nick region (overflow channel region) where a potential barrier, which is between the photodiode and the drain region in the photoelectric conversion device shown in FIGS. 10A and 10B, is not formed. The potential barrier here is constituted of the selectively oxidized film 1 and the channel stopping layer 2 that is directly below the film 1. By forming the nick region (overflow channel region) 9, the potential barrier is intentionally lowered in that region. In addition to the nick region 9, the selectively oxidized film 1 that surrounds the photodiodes 3 and 10 and the channel stopping layer 2 underneath the film 1 are also nicked at a region directly below the transfer electrode 6. This is for allowing electric charges to transfer from the photodiode 3 to the floating diffusion region 13.

As a result, when the photodiode 3 nears saturation, excess carriers flow out to the drain region 5 through the overflow channel region 9 where the barrier is low. Excess carriers are thus prevented from seeping into the photodiode 10 of the adjacent pixel, and the incidence of cross talk is reduced.

FIG. 1B deals with only impurity distribution. As to potential distribution, potentials are distributed throughout a region (potential barrier) 12 that is a bit larger than the channel stopping layer 2 to block carrier leakage into the photodiode 10 of the adjacent pixel.

Second Embodiment

Figures 2A, 2B:
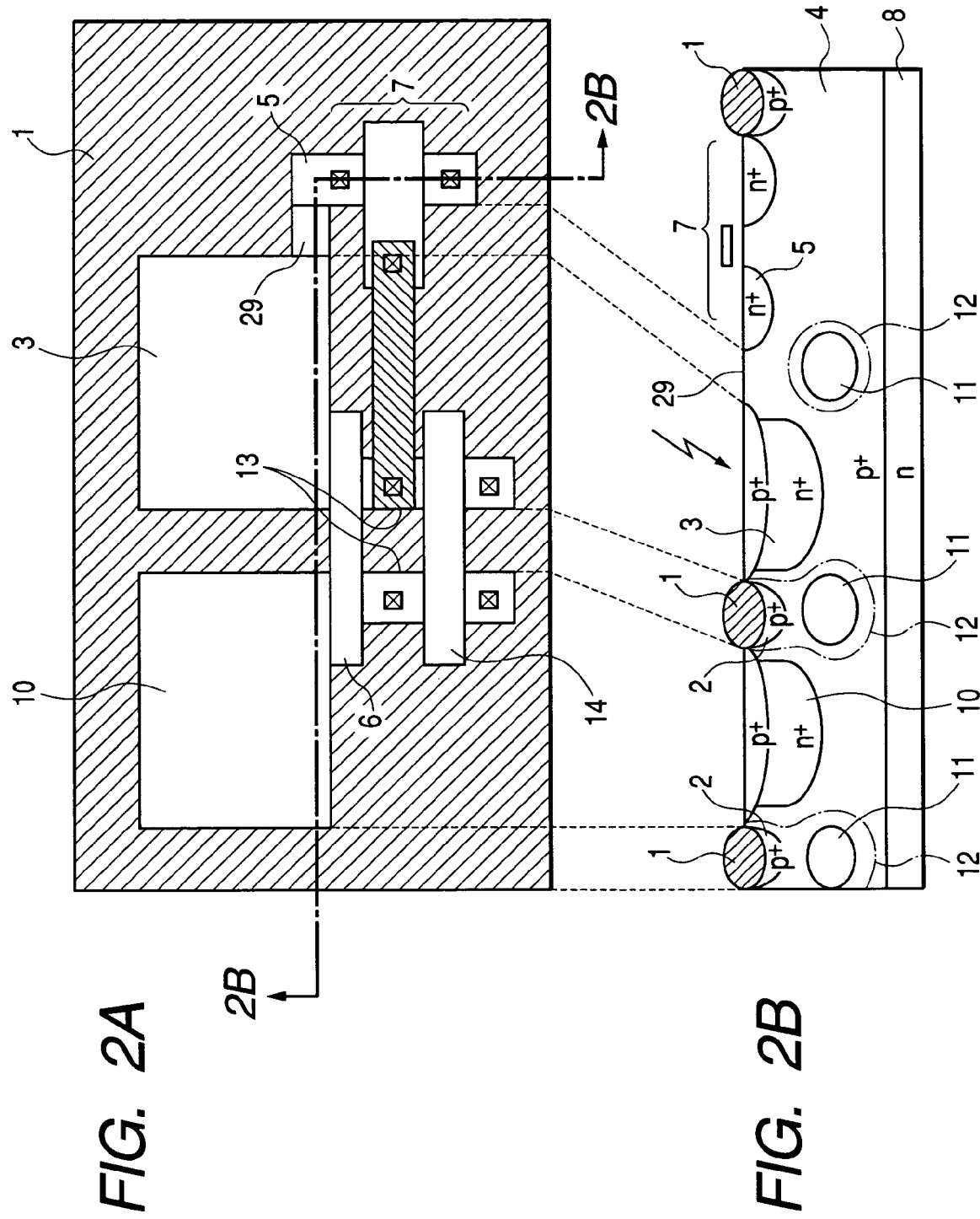
FIG. 2A is a plan view showing the structure of a photoelectric conversion device according to a second embodiment of the present invention.
FIG. 2B is a schematic sectional view taken along the line 2B-2B of FIG. 2A.

FIG. 2A is a plan view showing the structure of a photoelectric conversion device according to a second embodiment of the present invention, and FIG. 2B is a schematic sectional view taken along the line 2B-2B of FIG. 2A. In FIGS. 2A and 2B, structural members that are identical with those in FIGS. 1A and 1B are denoted by the same reference numerals, and explanations thereof are omitted.

This embodiment differs from the first embodiment in that a buried potential barrier layer (to serve as a buried isolation region) 11 is formed under the channel stopping layer 2 using a p type impurity to surround the photodiodes 3 and 10. A nick region 29 serves as an overflow channel region similar to the overflow channel region 9 of the first embodiment. Specifically, the nick region 29 is a region where the selectively oxidized film 1 and the channel stopping layer 2 are not formed. FIG. 2B mainly deals with impurity distribution. As to potential distribution, potentials are distributed throughout the region (potential barrier) 12 that is a bit larger than the channel stopping layer 2 and the potential barrier layer 11. The region 12 is indicated by a dot-dash line in the drawing, and is connected to the channel stopping layer 2 and the potential barrier layer 11 to form a wall in the longitudinal direction. With this structure, carriers (electrons) overflowing from the photodiode 3 are inclined to head toward the drain region 5 even more. Therefore, cross talk to the photodiode 10 of the adjacent pixel can further be reduced.

This embodiment and the following embodiments are different from the first embodiment in that the gates of the transfer transistors of the photodiodes 3 and 10 are formed from the same layer. However, the gates of the transfer transistors may be formed separately as in the first embodiment. The same applies to the gates of the resetting MOS transistors.

Third Embodiment

Figures 3A, 3B:
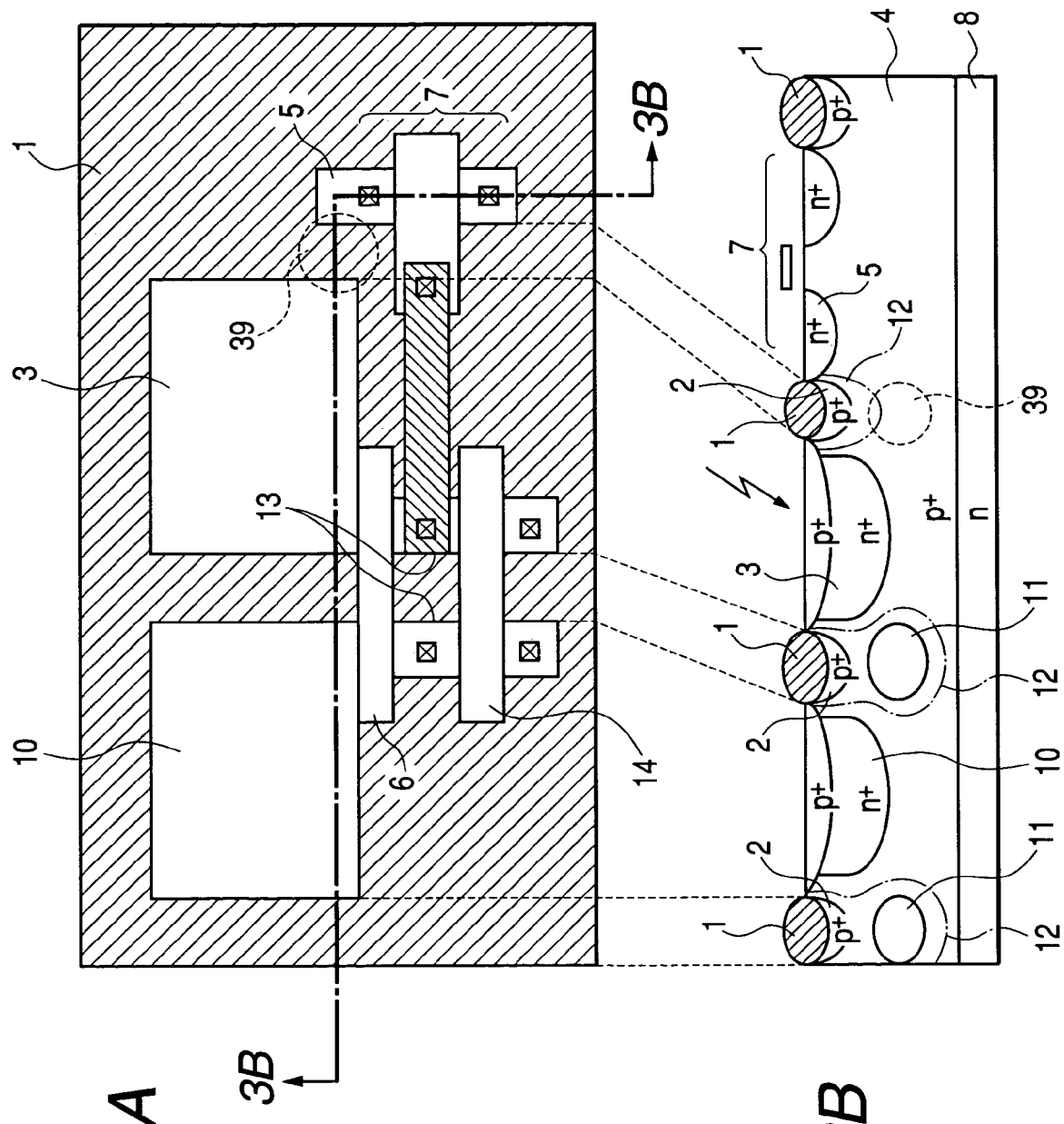
FIG. 3A is a plan view showing the structure of a photoelectric conversion device according to a third embodiment of the present invention.
FIG. 3B is a schematic sectional view taken along the line 3B-3B of FIG. 3A.

FIG. 3A is a plan view showing the structure of a photoelectric conversion device according to a third embodiment of the present invention, and FIG. 3B is a schematic sectional view taken along the line 3B-3B of FIG. 3A. In FIGS. 3A and 3B, structural members that are identical with those in FIGS. 2A and 2B are denoted by the same reference numerals, and explanations thereof are omitted.

In this embodiment, the buried potential barrier layer 11 and the channel stopping layer 2 above the layer 11 surround the photodiodes 3 and 10 as in the second embodiment. The difference between the two embodiments is that, in the third embodiment, the potential barrier layer 11 is absent only in a nick region 39, which is between the photodiode 3 and the drain region 5.

In FIG. 3B, potentials are distributed in the region (potential barrier) 12 that is a bit larger than the channel stopping layer 2 and the potential barrier layer 11. The region 12 is indicated by a dot-dash line in the drawing, and is connected to the perimeters of the channel stopping layer 2 and the potential barrier layer 11, or to the channel stopping layer 2 and the potential barrier layer 11, to form a wall in the longitudinal direction. The potential barrier layer 11 is nicked only in the nick region 39, thereby causing excess carriers to flow out to the drain region 5 through the interior of the substrate. In this way, cross talk between pixels is prevented.

Fourth Embodiment

FIG. 4A is a plan view showing the structure of a photoelectric conversion device according to a fourth embodiment of the present invention, and FIG. 4B is a schematic sectional view taken along the line 4B-4B of FIG. 4A.

This embodiment differs from the third embodiment in that polarities of a well and a substrate are reversed, that is, an n-well 104 and a p-substrate 108 are used.

As shown in FIGS. 4A and 4B, a photodiode (to serve as a photoelectric conversion region) 103 is formed in an n-well 104. Electric charges accumulated in the photodiode 103 are sent to a floating diffusion region 113 and to a gate of a MOS transistor 107, which is connected to the floating diffusion region 113, when the electric potential of a transfer electrode 106 is set to the high level. The MOS transistor 107 amplifies the electric charges to output signals. As shown in FIG. 4B, the photodiode 103 adjoins to a photodiode 110 (to serve as a photoelectric conversion region) of an adjacent pixel with a selectively oxidized film 101 separating the photodiode 103 from the photodiode 110. Reference numeral 102 denotes a channel stopper under the selectively oxidized film 101. Denoted by 105 is a drain region (to serve as a main electrode region) of the MOS transistor 107. Reference numeral 108 represents a p-substrate and 114, a gate of a resetting MOS transistor that is provided to reset the floating diffusion region 113 to a given electric potential. Note that, a MOS transistor for reading electric charges accumulated in the photodiode 110 is omitted from FIGS. 4A and 4B. The photodiode here is formed in a well but may instead be formed on a semiconductor substrate or in an epitaxial layer. The drain region is desirably connected to a fixed electric potential or a similar electric potential. The p-substrate, which is placed beneath the photodiode 103 as a substrate having the conductivity type opposite to the conductivity type of the photodiode 103, may be replaced by any semiconductor region such as an embedded layer or a semiconductor substrate as long as its conductivity type is opposite to that of the photodiode 103.

In this embodiment, the channel stopping layer 102, the potential barrier layer 111 and the substrate 108 constitute barriers that surround the photodiodes 103 and 110 three-dimensionally. This makes it possible to isolate one pixel from another, and accordingly more carriers can be collected. In FIG. 4B, potentials are distributed in a region that is a bit larger than the p-substrate 108, the channel stopping layer 102, and the potential barrier layer 111. The distributed potentials form a three-dimensional potential wall 112, which is indicated by a dot-dash line in the drawing and which is connected to the perimeters of the p-substrate 108, the channel stopping layer 102, and the potential barrier layer 111, or to the p-substrate 108, the channel stopping layer 102, and the potential barrier layer 111. Thus pixels can be electrically isolated from one another. The potential barrier layer 111 is nicked only in a nick region (overflow channel) 109 in order to obtain the overflow function and deliver excess electric charges to the drain region 105 without fail. The p+ region 111 (to serve as a buried isolation region) is positioned such that the MOS transistor 107 is protected against intrusion of carriers from the depth direction. To be specific, the p+ region 111 is placed directly below the MOS transistor 107. The p+ region 111 is also formed under the transfer electrode 106 and the resetting electrode 114 each. Another p+ region 111 may be formed under the floating diffusion region 113.

Fifth Embodiment

Figures 5A, 5B:
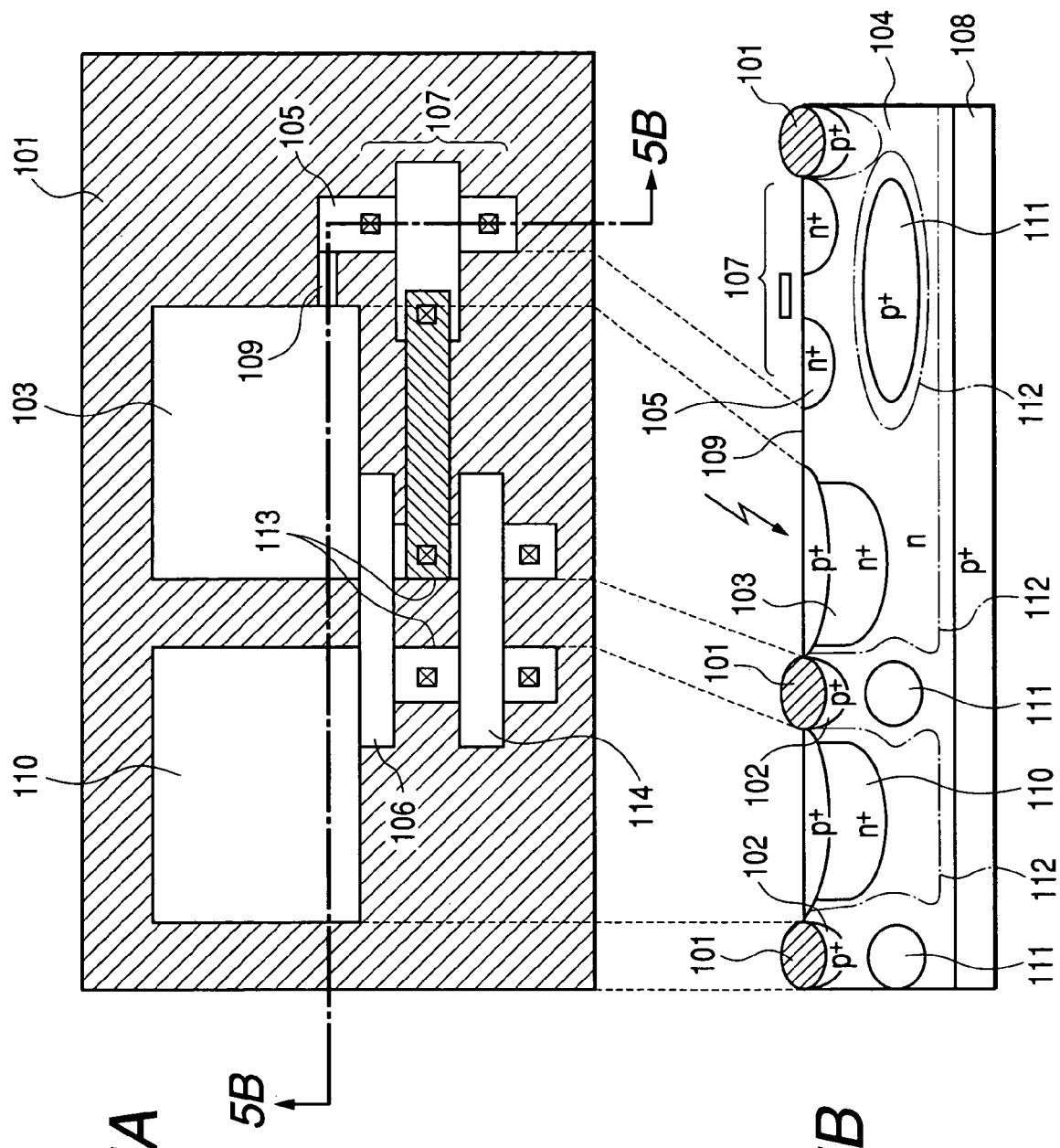
FIG. 5A is a plan view showing the structure of a photoelectric conversion device according to a fifth embodiment of the present invention.
FIG. 5B is a schematic sectional view taken along the line 5B-5B of FIG. 5A.

FIG. 5A is a plan view showing the structure of a photoelectric conversion device according to a fifth embodiment of the present invention, and FIG. 5B is a schematic sectional view taken along the line 5B-5B of FIG. 5A. In FIGS. 5A and 5B, structural members that are identical with those in FIGS. 4A and 4B are denoted by the same reference numerals and explanations thereof are omitted.

This embodiment differs from the fourth embodiment in that the width of the overflow channel 109 as a nick region is controlled to control the height of the channel barrier.

The overflow channel 109 in this embodiment is narrower in width than in FIG. 4A in order to suppress overflow. This is utilization of the fact that the potential barrier is dependent not only on impurity distribution but also on proximity effect of the potential barrier. Specifically, the effect is obtained by setting the width of the overflow channel 109 to 2 μm or less. If the gap width is about 0.8 μm, a barrier appropriate as an LOD (lateral overflow drain) can be formed. Pixels can be isolated from one another because of the potential wall 112 as in the fourth embodiment.

Sixth Embodiment

FIG. 6A is a plan view showing the structure of a photoelectric conversion device according to a sixth embodiment of the present invention, and FIG. 6B is a schematic sectional view taken along the line 6B-6B of FIG. 6A. In FIGS. 6A and 6B, structural members that are identical with those in FIGS. 5A and 5B are denoted by the same reference numerals and explanations thereof are omitted.

In this embodiment, the overflow channel 109 of the fourth embodiment is doped to create as an LOD an impurity distribution in lower concentrations than the normal barrier layer 111. This is achieved by doping the overflow channel (to serve as an impurity diffusion region) 109 alone with an impurity in low concentration, or through counter doping of the overflow channel region 109 using an impurity whose conductivity type is opposite to that of the barrier layer 111. Pixels can be isolated from one another because of the potential wall 112 as in the fourth embodiment.

Seventh Embodiment

Figures 7A, 7B:
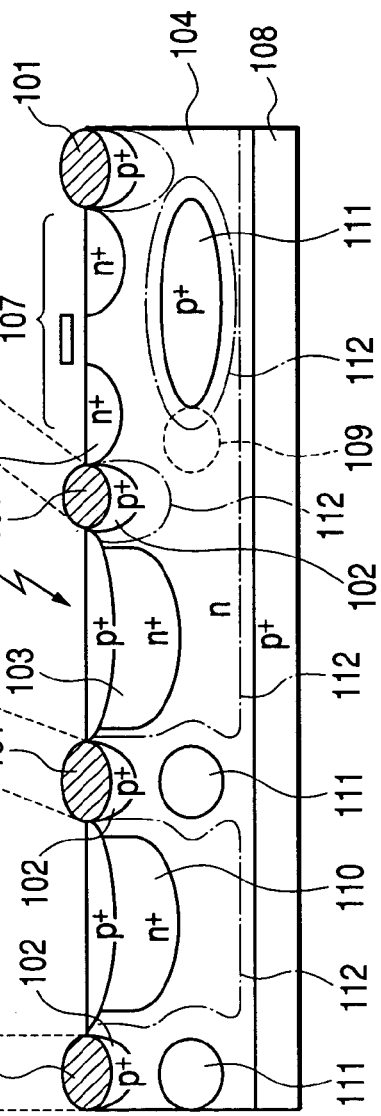
FIG. 7A is a plan view showing the structure of a photoelectric conversion device according to a seventh embodiment of the present invention.
FIG. 7B is a schematic sectional view taken along the line 7B-7B of FIG. 7A.

FIG. 7A is a plan view showing the structure of a photoelectric conversion device according to a seventh embodiment of the present invention, and FIG. 7B is a schematic sectional view taken along the line 7B-7B of FIG. 7A. In FIGS. 7A and 7B, structural members that are identical with those in FIGS. 4A and 4B are denoted by the same reference numerals and explanations thereof are omitted.

This embodiment is a modification of the fourth embodiment, and an overflow channel is formed by weakening the barrier in the substrate direction. A portion of the potential barrier layer 111 that is below the drain region 105 alone is removed, so that the potential barrier layer 111 does not extend to the area below the drain region 105 (the nick region 109). In this way, excess carriers from the photodiode 103 are delivered to the drain region 105 through the nick region 109. Similar to the fifth embodiment, the degree of overflow of the LOD can be controlled in this embodiment by adjusting the width of the nick region 109. Pixels can be isolated from one another because of the potential wall 112 as in the fourth embodiment.

Eighth embodiment

Figures 8A, 8B:
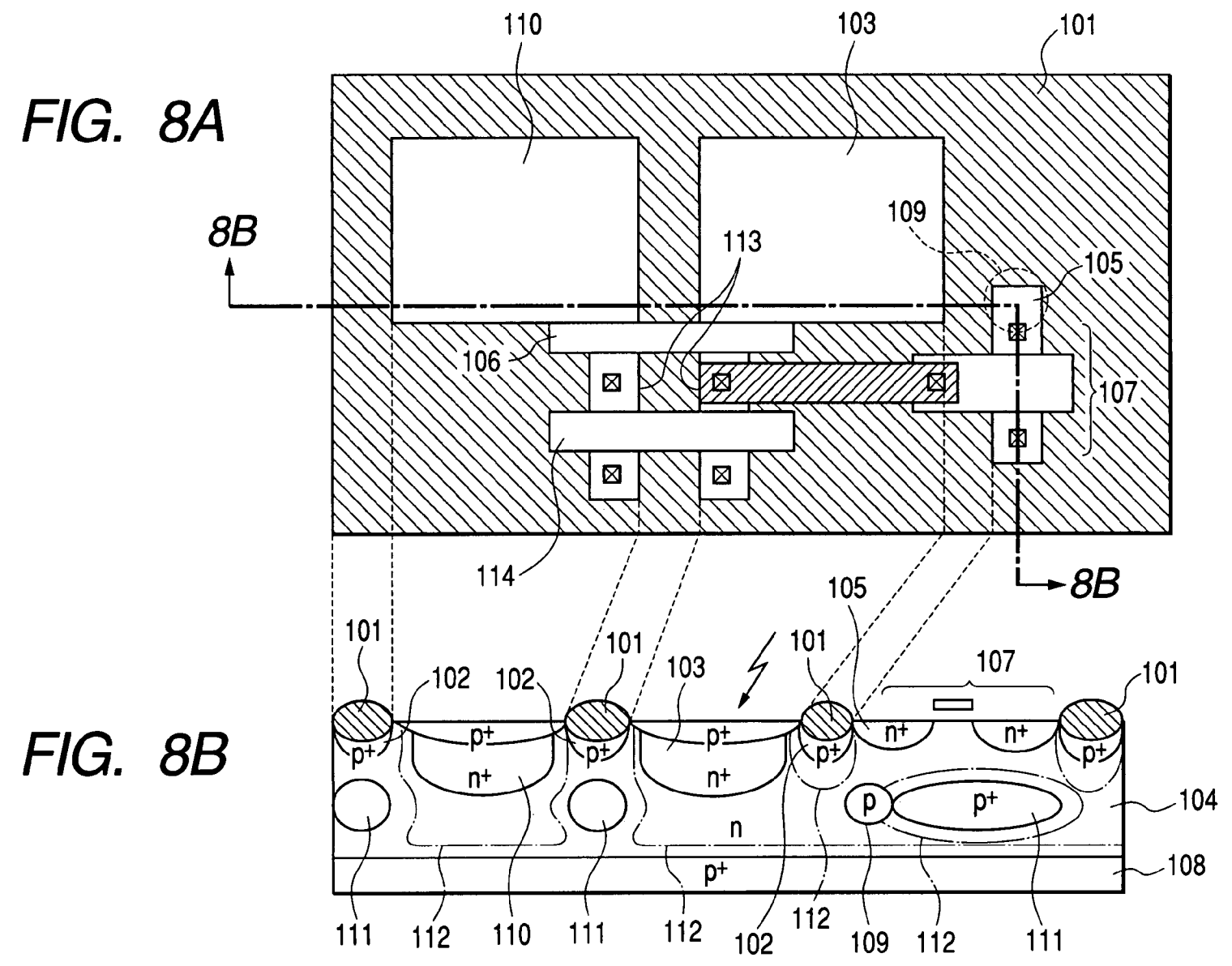

FIG. 8A is a plan view showing the structure of a photoelectric conversion device according to a eighth embodiment of the present invention, and FIG. 8B is a schematic sectional view taken along the line 8B-8B of FIG. 8A. In FIGS. 8A and 8B, structural members that are identical with those in FIGS. 7A and 7B are denoted by the same reference numerals and explanations thereof are omitted.

In this embodiment, the overflow channel 109 of the seventh embodiment serving as a nick region is doped to create as an LOD an impurity distribution in lower concentrations than the normal barrier layer 111. This is achieved by doping the nick region 109 alone with an impurity in low concentration, or through counter doping of the nick region 109 using an impurity whose conductivity type is opposite to that of the barrier layer 111. Pixels can be isolated from one another because of the potential wall 112 as in the fourth embodiment.

The conductivity type of every impurity in the embodiments described above is specified as either p or n. Note that this is solely for ease of understanding and that the same effect is obtained even if those polarities are reversed.

Described next is an image pick-up system that uses one of the photoelectric conversion devices of the above embodiments. A detailed description is given with reference to FIG. 9 on an example of integrating a photoelectric conversion device of the present invention with a scanning circuit and other circuits for reading signals to obtain a solid state image pick-up device and applying the solid state image pick-up device to a still camera.

Figure 9:
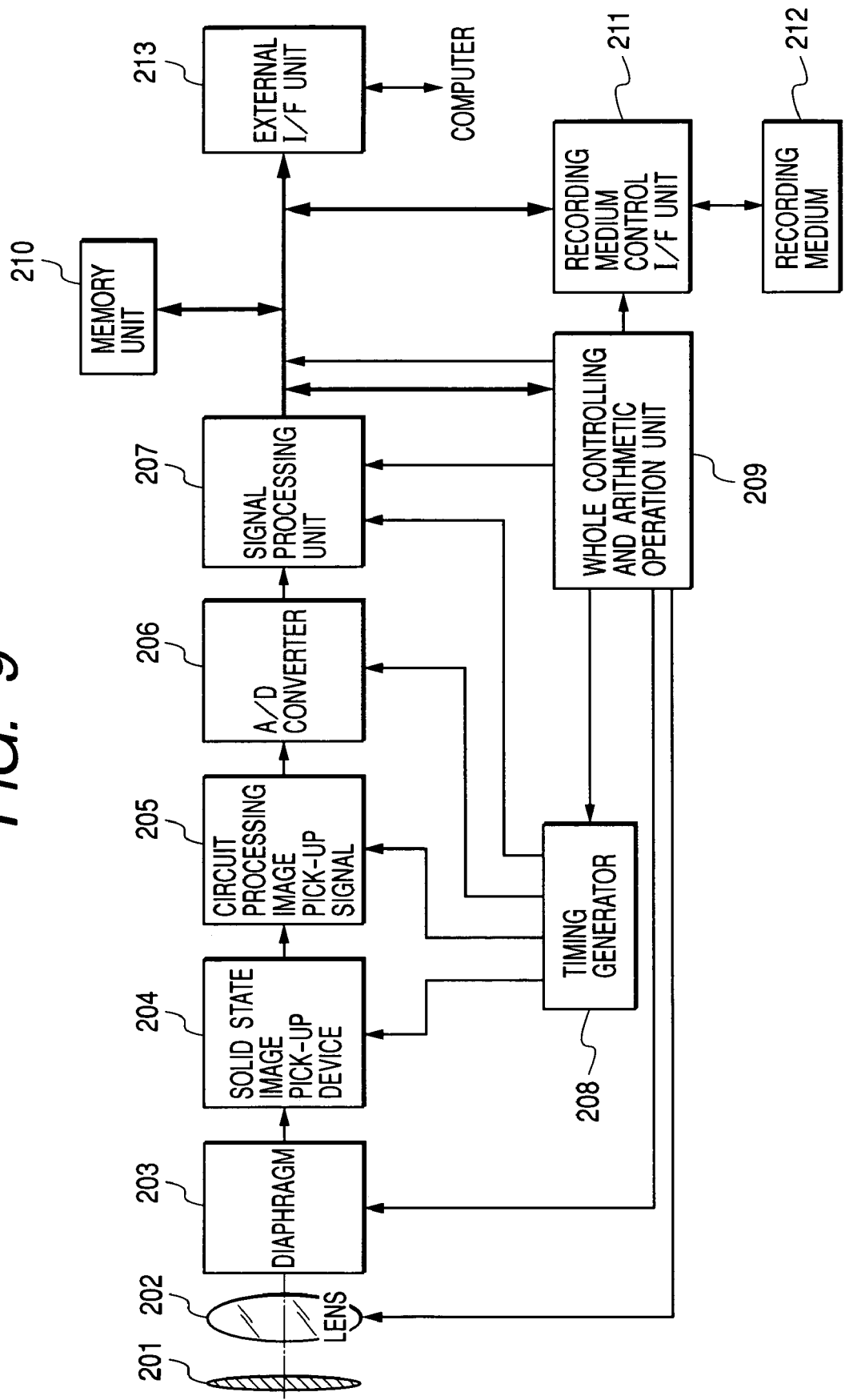
FIG. 9 is a block diagram of a still video camera to which a photoelectric conversion device of the present invention is applied.

FIG. 9 is a block diagram of a still video camera to which a photoelectric conversion device of the present invention is applied.

In FIG. 9, reference numeral 201 denotes a barrier that doubles as a lens protector and a main switch, 202 represents a lens for forming an optical image of a subject in a solid state image pick-up device (photoelectric conversion device) 204, and 203 designates a diaphragm for varying the amount of light that passes through the lens 202. The solid state image pick-up device 204 picks up as a video signal an image of a subject which is formed by the lens 202. Denoted by 206 is an A/D converter for analog-digital conversion of a video signal outputted from the solid state image pick-up device 204. Reference numeral. 207 denotes a signal processing unit for correcting in various ways image data outputted from the A/D converter 206 and for compressing the data. Reference numeral 208 represents a timing generator for outputting various timing signals to the solid state image pick-up device 204, an image pick-up signal processing circuit 205, the A/D converter 206, and the signal processing unit 207. Denoted by 209 is a whole controlling and arithmetic operation unit for performing various calculations and for overall control of the still video camera. Reference numeral 210 is a memory unit for storing image data temporarily. Reference numeral 211 represents an interface unit for recording data in a recording medium or reading data from a recording medium. Reference numeral 212 is a detachable recording medium such as a semiconductor memory for recording and reading of image data. Reference numeral 213 represents an interface unit for communicating with an external computer or the like.

An image shooting operation of the still video camera structured as above is described next.

The barrier 201 is opened turning a main power on. Then, the control system is turned on, and the circuits of the image pick-up system such as the A/D converter 206 are turned on.

Subsequently, the whole controlling and arithmetic operation unit 209 opens the diaphragm 203 to control the light exposure amount. A signal outputted from the solid state image pick-up device 204 is converted by the A/D converter 206, and the converted signal is inputted to the signal processing unit 207. Based on the inputted data, the whole controlling and arithmetic operation unit 209 calculates exposure.

The brightness is judged from the result of the photometry, and the whole controlling and arithmetic operation unit 209 adjusts the diaphragm according to the results.

Next, the whole controlling and arithmetic operation unit 209 calculates the distance from the subject extracting a high frequency component from the signal outputted by the solid state image pick-up device 204. The lens is then driven, and it is judged whether the subject is in focus or not. If the subject is not in focus, the lens is driven again, and the distance is measured.

After it is confirmed that the subject is in focus, actual light exposure is started. As the light exposure is completed, a video signal outputted from the solid state image pick-up device 204 receives A-D conversion in the A/D converter 206. The converted signal passes through the signal processing unit 207 and is written in the memory unit by the whole controlling and arithmetic operation unit 209. Thereafter, data accumulated in the memory unit 210 are sent through the recording medium control I/F unit 211 by the whole controlling and arithmetic operation unit 209 to be recorded in the detachable recording medium 212 such as a semiconductor memory. Alternatively, the accumulated data may be sent through the external I/F unit 213 to be inputted directly to a computer or the like for image processing.

Given above are descriptions of embodiments of the present invention while preferred modes of carrying out the present invention are listed below.

(Preferred Mode 1)

A photoelectric conversion device including: a photoelectric conversion region for accumulating electric charges that correspond to incident light; and an amplifying filed effect transistor into which a signal charge from the photoelectric conversion region is inputted, characterized in that:

the photoelectric conversion region is surrounded by a potential barrier region;

a nick region is formed in a part of the potential barrier region; and one of main electrode regions of the field effect transistor is placed next to the nick region, the main electrode region having the same conductivity type as the photoelectric conversion region.

(Preferred Mode 2)

A photoelectric conversion device according to Preferred Mode 1, characterized in that the potential barrier region includes at least a selectively oxidized film and a channel stopping layer directly below the selectively oxidized film.

(Preferred Mode 3)

A photoelectric conversion device according to Preferred Mode 1, characterized in that the potential barrier region includes at least a buried isolation region whose conductivity type is opposite to that of the photoelectric conversion region.

(Preferred Mode 4)

A photoelectric conversion device accordingto any one of Preferred Modes 1 through 3, characterized in that the photoelectric conversion region is formed in a low impurity concentration region that is doped with an impurity of the same conductivity type as the photoelectric conversion region in a concentration lower than the impurity concentration of the photoelectric conversion region.

(Preferred Mode 5)

A photoelectric conversion device according to Preferred Mode 4, characterized in that a buried isolation region whose conductivity type is opposite to the conductivity type of the photoelectric conversion region is formed below the field effect transistor.

(Preferred Mode 6)

A photoelectric conversion device according to Preferred Mode 5, characterized in that the buried isolation region placed below the field effect transistor surrounds a region larger than the photoelectric conversion region, and that the region surrounded by the buried isolation region functions as a photosensitive region.

(Preferred Mode 7)

A photoelectric conversion device according to any one of Preferred Modes 1 through 6, characterized in that an impurity diffusion region whose conductivity type is opposite to the conductivity type of the photoelectric conversion region is provided in the nick region.

(Preferred Mode 8)

A photoelectric conversion device according to Preferred Mode 5, characterized in that the buried isolation region is not placed in an area below the one main electrode region of the field effect transistor, at least, a part of the area.

(Preferred Mode 9)

A photoelectric conversion device according to Preferred Mode 1, characterized in that the potential barrier region includes at least a semiconductor region whose conductivity type is opposite to the conductivity type of the photoelectric conversion region, and that a buried region that is doped with an impurity of the same conductivity type as the semiconductor region in a concentration lower than the impurity concentration of the semiconductor region is placed in the nick region.

(Preferred Mode 10)

A photoelectric conversion device according to Preferred Mode 4, characterized in that the low impurity concentration region is a semiconductor substrate, an epitaxial layer, or a well.

(Preferred Mode 11)

A photoelectric conversion device according to any one of Preferred Modes 1 through 10, characterized in that the one main electrode region is connected to a fixed electric potential or a similar electric potential.

(Preferred Mode 12)

A photoelectric conversion device according to any one of Preferred Modes 1 through 11, characterized in that a semiconductor region whose conductivity type is opposite to the conductivity type of the photoelectric conversion region is placed below the photoelectric conversion region.

(Preferred Mode 13)

An image pick-up system characterized by including: a solid state image pick-up device according to any one of Preferred Modes 1 through 12; an optical system for forming an image in the solid state image pick-up device; and a signal processing circuit for processing a signal outputted from the solid state image pick-up device.

As described above, according to the present invention, excess carriers are prevented from flowing into adjacent pixels or other floating terminals when the diode nears saturation by forming an LOD (lateral overflow drain) such that the photoelectric conversion region is surrounded by a potential barrier, a part of the barrier is removed to form a low barrier portion, and a main electrode region of the field effect transistor is placed in front of the low barrier portion. Accordingly, smearing and cross talk can be avoided, and thus a photoelectric conversion device having higher sensitivity and less cross talk is obtained.

What is claimed is:

1. A photoelectric conversion device comprising:
a plurality of photoelectric conversion regions, each photoelectric conversion region having a first semiconductor region for accumulating electric charges that correspond to incident light;
a plurality of electrodes, each electrode being arranged at a side of a corresponding first semiconductor region for transferring a signal charge from said first semiconductor region; and
a plurality of amplifying field effect transistors, each field effect transistor receiving a signal charge from a corresponding photoelectric conversion region inputted by a corresponding electrode, wherein:
each first semiconductor region is surrounded by a potential barrier region that includes at least an oxidized film for isolation, a channel stopping layer directly below said oxidized film, and a buried isolation region whose conductivity type is opposite to said conductivity type of said first semiconductor region below said channel stopping layer,
for each potential barrier region, a nick region is formed in a part of said potential barrier region and is arranged at a side different from a side at which a corresponding electrode is arranged, such that said potential barrier region does not include a buried isolation region at said part in which said nick region is formed, and a source or drain region of each field effect transistor is placed adjacent to a corresponding nick region, said source or drain region having a same conductivity type as a conductivity type of said first semiconductor regions.

2. A photoelectric conversion device according to claim 1, wherein each first semiconductor region is formed in a low impurity concentration region that is doped with an impurity of a same conductivity type as said conductivity type of said first semiconductor regions at an impurity concentration lower than an impurity concentration of said first semiconductor regions, and
wherein said buried isolation regions, whose conductivity type is opposite to said conductivity type of said first semiconductor regions, is formed below each field effect transistor, respectively.

3. A photoelectric conversion device according to claim 2, wherein each of said buried isolation regions surrounds a region larger than a corresponding first semiconductor region, and
wherein said region surrounded by said corresponding buried isolation region functions as a photosensitive region.

4. A photoelectric conversion device according to claim 2, wherein each buried isolation region is not positioned at least in part in an area below a source or drain region, adjacent to a corresponding nick region, of a corresponding field effect transistor.

5. A photoelectric conversion device according to claim 2, wherein said low impurity concentration region is one of a semiconductor substrate, an epitaxial layer, and a well.

6. A photoelectric conversion device according to claim 1, wherein each source or drain region is connected to a fixed electric potential or a similar electric potential.

7. A photoelectric conversion device according to claim 1, wherein a semiconductor region whose conductivity type is opposite to a conductivity type of said plurality of photoelectric conversion regions is positioned below each of said first semiconductor regions, respectively.

8. A photoelectric conversion device according to claim 1, wherein said photoelectric conversion device is part of an image pick-up system that includes:
an optical system for forming an image in said photoelectric conversion device; and
a signal processing circuit for processing a signal outputted from said photoelectric conversion device.

9. A photoelectric conversion device comprising:
a plurality of photoelectric conversion regions, each photoelectric conversion region having a first semiconductor region for accumulating electric charges that correspond to incident light;
a plurality of electrodes, each electrode being arranged at a side of a corresponding first semiconductor region for transferring a signal charge from said first semiconductor region; and
a plurality of amplifying field effect transistors, each field effect transistor receiving a signal charge from a corresponding photoelectric conversion region inputted by a corresponding electrode, wherein:
each first semiconductor region is surrounded by a potential barrier region that includes at least an oxidized film for isolation, a channel stopping layer directly below said oxidized film, and a buried isolation region whose conductivity type is opposite to said conductivity type of said first semiconductor region below said channel stopping layer, and
for each potential barrier region, a nick region is formed in a part of said potential barrier region, said nick region being arranged between a corresponding first semiconductor region and a source or drain region of a corresponding field effect transistor, and said nick region being arranged at a side different from a side at which a corresponding electrode is arranged, such that said potential barrier region does not include a corresponding buried isolation region at said part in which said nick region is formed, said source or drain region of said corresponding field effect transistor being positioned adjacent to said nick region, and said source or drain region having a same conductivity type as a conductivity type of said first semiconductor regions.

10. A photoelectric conversion device according to claim 9, wherein each first semiconductor region is formed in a low impurity concentration region that is doped with an impurity of a same conductivity type as said conductivity type of said first semiconductor regions at an impurity concentration lower than an impurity concentration of said first semiconductor regions, and
wherein said buried isolation regions, whose conductivity type is opposite to said conductivity type of said first semiconductor regions, is formed below each field effect transistor, respectively.

11. A photoelectric conversion device according to claim 9, wherein said photoelectric conversion device is part of an image pick-up system that includes:
an optical system for forming an image in said photoelectric conversion device; and
a signal processing circuit for processing a signal outputted from said photoelectric conversion device.

12. A photoelectric conversion device comprising:
a photoelectric conversion region having a first semiconductor region of a first conductivity type for accumulating a signal charge corresponding to an incident light; and
a plurality of amplifying field effect transistors, each receiving said signal charge from said photoelectric conversion region, wherein:
between said first semiconductor region and a second semiconductor region adjacent to said first semiconductor region, an oxide film for element isolation, a channel stop layer just under said oxide film, and a buried layer of a second conductivity type just under said channel stop layer are arranged, and
between said first semiconductor region and a main electrode region of an amplifying field effect transistor, said oxide film and said channel stop layer are arranged, and said buried layer is not arranged.

13. A photoelectric conversion device according to claim 12, wherein:
said first semiconductor region is formed in a second semiconductor region of said first conductivity type that has an impurity concentration lower than that of said first semiconductor region,
a third semiconductor region of said second conductivity type is arranged under said amplifying field effect transistor, and
said third semiconductor region is not arranged under said main electrode of said amplifying field effect transistor.

14. A photoelectric conversion device according to claim 12, wherein said photoelectric conversion device is part of an image pick-up system that includes:
an optical system for forming an image in said photoelectric conversion device; and
a signal processing circuit for processing a signal outputted from said photoelectric conversion device.

* * * * *